(12) United States Patent
Wang et al.

(10) Patent No.: US 12,306,509 B2
(45) Date of Patent: May 20, 2025

(54) ARRAY SUBSTRATE AND DISPLAY PANEL

(71) Applicant: BOE TECHNOLOGY GROUP CO., LTD., Beijing (CN)

(72) Inventors: Lizhong Wang, Beijing (CN); Guangcai Yuan, Beijing (CN); Ce Ning, Beijing (CN); Jianbo Xian, Beijing (CN); Liping Lei, Beijing (CN); Chunping Long, Beijing (CN); Yunping Di, Beijing (CN); Binbin Tong, Beijing (CN); Zhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/574,261

(22) PCT Filed: Jan. 10, 2023

(86) PCT No.: PCT/CN2023/071591
§ 371 (c)(1),
(2) Date: Dec. 26, 2023

(87) PCT Pub. No.: WO2023/134674
PCT Pub. Date: Jul. 20, 2023

(65) Prior Publication Data
US 2024/0241415 A1 Jul. 18, 2024

(30) Foreign Application Priority Data
Jan. 14, 2022 (CN) .......................... 202210041921.7

(51) Int. Cl.
*G02F 1/1368* (2006.01)
*G02F 1/1362* (2006.01)

(52) U.S. Cl.
CPC ...... *G02F 1/1368* (2013.01); *G02F 1/136222* (2021.01); *G02F 1/136286* (2013.01)

(58) Field of Classification Search
CPC ............. G02F 1/1368; G02F 1/136222; G02F 1/136286
See application file for complete search history.

(56) References Cited

U.S. PATENT DOCUMENTS 10,459,302 B2   10/2019   Zhang
2011/0141423 A1  6/2011   Cheng et al.
(Continued)

FOREIGN PATENT DOCUMENTS

CN   104880878 A   9/2015
CN   105824160 A   8/2016
(Continued)

OTHER PUBLICATIONS

CN 108231671 A machine translation (Year: 2018).*
First Office Action dated Mar. 1, 2022 received in Chinese Patent Application No. CN 202210041921.7.

*Primary Examiner* — James A Dudek
(74) *Attorney, Agent, or Firm* — SCULLY, SCOTT, MURPHY & PRESSER, P.C.

(57) ABSTRACT

An array substrate and a display panel. The array substrate includes: a base substrate; a gate line and a data line on the base substrate, the gate line intersect the data line to define a pixel region; a metal oxide thin film transistor is arranged in the pixel region, the metal oxide thin film transistor includes a metal oxide semiconductor layer; the metal oxide semiconductor layer includes a first part and a second part; the first part and the data line are connected through a first via hole; the first part is in a stripe shape; a first included angle is between extension directions of the first part and the data line; an orthographic projection of the second part overlap with an orthographic projection of the gate line on (Continued)

the base substrate and do not overlap with an orthographic projection of the data line on the base substrate.

16 Claims, 7 Drawing Sheets

(56) References Cited

U.S. PATENT DOCUMENTS

| | | |
|---|---|---|
| 2014/0253850 A1 | 9/2014 | Lee et al. |
| 2017/0146844 A1 | 5/2017 | Yang et al. |
| 2019/0103454 A1 | 4/2019 | So et al. |
| 2019/0155091 A1 | 5/2019 | Chen et al. |
| 2019/0206894 A1 | 7/2019 | Lee et al. |
| 2021/0091123 A1 | 3/2021 | Ren et al. |
| 2021/0215596 A1 | 7/2021 | Liu et al. |
| 2021/0376285 A1 | 12/2021 | Yan et al. |
| 2022/0376020 A1 | 11/2022 | Yang et al. |

FOREIGN PATENT DOCUMENTS

| | | | | |
|---|---|---|---|---|
| CN | 106684101 A | | 5/2017 | |
| CN | 107577100 A | | 1/2018 | |
| CN | 108008582 A | | 5/2018 | |
| CN | 108231671 A | * | 6/2018 | ......... H01L 27/1225 |
| CN | 109659326 A | | 4/2019 | |
| CN | 110581144 A | | 12/2019 | |
| CN | 110930883 A | | 3/2020 | |
| CN | 111584600 A | | 8/2020 | |
| CN | 113192977 A | | 7/2021 | |
| CN | 113196374 A | | 7/2021 | |
| CN | 114068590 A | | 2/2022 | |
| KR | 20080051627 A | | 6/2008 | |

\* cited by examiner

ARRAY SUBSTRATE AND DISPLAY PANEL

CROSS-REFERENCE TO RELATED APPLICATIONS

This application is a U.S. National Phase Entry under 35 U.S.C. § 371 of PCT International Patent Application No. PCT/CN2023/071591, filed on Jan. 10, 2023, which claims priority to and benefits of the Chinese Patent Application No. 202210041921.7, filed on Jan. 14, 2022. For all purposes, the entire disclosure of the aforementioned applications are incorporated by reference as part of the disclosure of this application.

TECHNICAL FIELD

Embodiments of the present disclosure relate to an array substrate and a display panel.

BACKGROUND

Virtual reality technology is a new technology that integrates real world information and virtual world information seamlessly. Compared with conventional display products, the most obvious feature of virtual reality display products is their super-high resolution. With the development of photoelectric technology and semiconductor manufacturing technology, in a display device, for example, thin film transistor liquid crystal display (TFT-LCD) occupies a dominant position in the current display market with its superior characteristics such as high quality image quality, high space utilization, low power consumption and no radiation. At present, the resolution of virtual reality liquid crystal display products on the market has been very high, but its display effect still cannot meet people's needs. The main reason is that the screen window effect will appear when the display panel is close to the user's eyes.

SUMMARY

At least one embodiment of the present disclosure provides an array substrate and a display panel, and in the array substrate, the first part of the metal oxide semiconductor layer is connected to the data line through a first via hole, the first part is in a stripe shape, and a first included angle is between an extension direction of the first part and an extension direction of the data line, and the first included angle is greater than 0 degree and less than or equal to 90 degrees; an orthographic projection of the second part on the base substrate overlaps with an orthographic projection of the gate line on the base substrate and does not overlap with an orthographic projection of the data line on the base substrate, which removes a source electrode structure, thereby improving the pixel aperture ratio.

At least one embodiment of the present disclosure provides an array substrate, and the array substrate comprises: a base substrate; a gate line and a data line that are arranged on the base substrate, the gate line intersects the data line to define a pixel region; a metal oxide thin film transistor is arranged in the pixel region, and the metal oxide thin film transistor comprises a metal oxide semiconductor layer; the metal oxide semiconductor layer comprises a first part and a second part which are connected with each other, the first part is connected to the data line through a first via hole, the first part is in a stripe shape, and a first included angle is between an extension direction of the first part and an extension direction of the data line, and the first included angle is greater than 0 degree and less than or equal to 90 degrees; an orthographic projection of the second part on the base substrate overlaps with an orthographic projection of the gate line on the base substrate and does not overlap with an orthographic projection of the data line on the base substrate.

For example, in the array substrate provided by at least one embodiment of the present disclosure, the metal oxide thin film transistor further comprises a first insulation layer, a light shielding layer, a first interlayer insulation layer, a gate insulation layer, a first gate electrode, a second interlayer insulation layer, a first drain electrode and a second insulation layer which are sequentially stacked on the base substrate, the metal oxide semiconductor layer is arranged between the first interlayer insulation layer and the gate insulation layer, the first gate electrode is connected with the gate line, and the second part is electrically connected with the first drain electrode.

For example, the array substrate provided by at least one embodiment of the present disclosure, further comprises a driving transistor, and the metal oxide thin film transistor is arranged in a display region, and the driving transistor is arranged in a peripheral region surrounding the display region; the driving transistor comprises a polysilicon layer, the first insulation layer, a second gate electrode, the first interlayer insulation layer, the gate insulation layer and a source-drain electrode layer which are sequentially stacked on the base substrate, the source-drain electrode layer comprises a second source electrode and a second drain electrode, and the second source electrode and the second drain electrode are respectively electrically connected with the polysilicon layer.

For example, in the array substrate provided by at least one embodiment of the present disclosure, a shape of the metal oxide semiconductor layer on a plane parallel to a main surface of the base substrate is a stripe shape, and a planar shape of a closed area formed by intersection of an orthographic projection of the metal oxide semiconductor layer, the orthographic projection of the data line and the orthographic projection of the gate line on the base substrate is triangular.

For example, in the array substrate provided by at least one embodiment of the present disclosure, a shape of the metal oxide semiconductor layer on a plane parallel to a main surface of the base substrate is a zigzag line, and a planar shape of a closed area formed by intersection of an orthographic projection of the metal oxide semiconductor layer, the orthographic projection of the data line and the orthographic projection of the gate line on the base substrate is a rectangle or a right trapezoid.

For example, in the array substrate provided by at least one embodiment of the present disclosure, a shape of the metal oxide semiconductor layer on a plane parallel to a main surface of the base substrate is a zigzag line, and a planar shape of a closed area formed by intersection of an orthographic projection of the metal oxide semiconductor layer, the orthographic projection of the data line and the orthographic projection of the gate line on the base substrate is a polygon with a total number of sides greater than or equal to 5.

For example, in the array substrate provided by at least one embodiment of the present disclosure, the second part is in a stripe shape, an extension direction of the second part is the same as the extension direction of the data line, and the second part is between adjacent data lines in an extension direction of the gate line.

For example, in the array substrate provided by at least one embodiment of the present disclosure, a first end of the second part away from the first part and a second end of the first part close to the second part are located at different sides of the gate line in the extension direction of the data line, and the second part is electrically connected with the first drain electrode at a position of the first end.

For example, in the array substrate provided by at least one embodiment of the present disclosure, the second gate electrode is arranged in a same layer as the light shielding layer, and the source-drain electrode layer is arranged in a same layer as the first gate electrode.

For example, in the array substrate provided by at least one embodiment of the present disclosure, a width of the first part in the extension direction of the data line ranges from 10% to 50% of a width of the second part in an extension direction of the gate line, and an area of the first part ranges from 10% to 30% of an area of the second part.

For example, in the array substrate provided by at least one embodiment of the present disclosure, a region where the metal oxide semiconductor layer and the first gate electrode are stacked is a channel region, and a remaining region is a conductive region, and a ratio of a length of the channel region to a length of the conductive region ranges from 1/5 to 1/4 along the extension direction of the data line.

For example, in the array substrate provided by at least one embodiment of the present disclosure, the pixel region comprises pixels, P=S1/Stotal, P is a proportion of the metal oxide semiconductor layer, S1 is an area of the metal oxide semiconductor layer, and Stotal is equal to Lp*WP, Lp is a length of the pixel region, and WP is a width of the pixel region; S1min≤S1≤S1max, S1min=(D−Wdata)/2*sin α)*(Lp−D), S1max=(D−Wdata)/2*tan α)*(Lp−D)+(D−Wdata)/2)*(Lp−D), S1min is a minimum area of the metal oxide semiconductor layer; S1max is a maximum area of the metal oxide semiconductor layer; D is a distance between the oxide semiconductor layers of two adjacent pixels; Wdata is a width of the data line along an extension direction of the gate line on a plane parallel to a main surface of the base substrate; α is the first included angle; the proportion P of the metal oxide semiconductor layer is in a range of 0.2~0.4.

For example, in the array substrate provided by at least one embodiment of the present disclosure, the proportion P of the metal oxide semiconductor layer is in a range of 0.26~0.32; a magnitude of the first included angle α is in a range of 10°~75°.

For example, in the array substrate provided by at least one embodiment of the present disclosure, along the extension direction of the data line, a distance from the first via hole to the gate line is in a range of 4.0 microns-4.8 microns; on the plane parallel to the main surface of the base substrate and in a direction parallel to an extension direction of the gate line, a distance between a region, where the metal oxide semiconductor layer overlaps with the gate line, and the data line is in a range of 0.9 microns-1.1 microns; a width of the data line is in a range of 1.3 microns-1.5 microns along the extension direction of the gate line, and a thickness of the data line is in a range of 0.8 microns-1.2 microns in a direction perpendicular to the main surface of the base substrate; on the plane parallel to the main surface of the base substrate, an area of a region where the metal oxide semiconductor layer overlaps with the data line is in a range of 0.05 square microns-0.10 square microns; along the extension direction of the data line, a width of the gate line is in a range of 2.3 microns-2.8 microns.

For example, in the array substrate provided by at least one embodiment of the present disclosure, light transmittance in a region corresponding to the metal oxide semiconductor layer is in a range of 50%~70%, and light transmittance outside the region corresponding to the metal oxide semiconductor layer and outside a region corresponding to the gate line and the data line is in a range of 65%~75%.

For example, in the array substrate provided by at least one embodiment of the present disclosure, the first included angle α is 30 degrees, and the proportion P of the metal oxide semiconductor layer is in a range of 0.24-0.3.

For example, in the array substrate provided by at least one embodiment of the present disclosure, a total resistance R of the metal oxide semiconductor layer satisfies R=M*Tr*Rs/Ttotal, Tr is transmittance of the metal oxide semiconductor layer in a unit area of the pixel region, Rs is a square resistance of the metal oxide semiconductor layer, Ttotal is total transmittance of the metal oxide semiconductor layer, and M=0.5-1.2.

For example, in the array substrate provided by at least one embodiment of the present disclosure, the total resistance R of the metal oxide semiconductor layer satisfies 1.3*Tr*Rs≤R≤2*Tr*Rs.

For example, in the array substrate provided by at least one embodiment of the present disclosure, 40%≤Tr≤90%, and the Ttotal is in a range of 50%-70%.

For example, in the array substrate provided by at least one embodiment of the present disclosure, the proportion of the metal oxide semiconductor layer is in a range of 0.26-0.32; the first included angle α is in a range of 30 degrees-45 degrees.

For example, in the array substrate provided by at least one embodiment of the present disclosure, along the extension direction of the data line, a distance from the first via hole to the gate line is in a range of 4.0 microns-4.8 microns; on the plane parallel to the main surface of the base substrate and in a direction parallel to an extension direction the gate line, a distance between a region, where the metal oxide semiconductor layer overlaps with the gate line, and the data line is in a range of 0.9 microns-1.1 microns; a width of the data line is in a range of 1.3 microns-1.5 microns along the extension direction of the gate line, and a thickness of the data line is in a range of 0.8 microns-1.2 microns in a direction perpendicular to the main surface of the base substrate; on the plane parallel to the main surface of the base substrate, an area of a region where the metal oxide semiconductor layer overlaps with the data line is in a range of 0.05 square microns-0.10 square microns; along the extension direction of the data line, a width of the gate line is in a range of 2.3 microns-2.8 microns.

For example, in the array substrate provided by at least one embodiment of the present disclosure, light transmittance in a region corresponding to the metal oxide semiconductor layer is in a range of 50%~70%, and light transmittance outside the region corresponding to the metal oxide semiconductor layer and outside a region corresponding to the gate line and the data line is in a range of 65%~75%.

For example, in the array substrate provided by at least one embodiment of the present disclosure, the first included angle α is equal to 30 degrees, and the proportion P of the metal oxide semiconductor layer is in a range of 0.24-0.30.

For example, in the array substrate provided by at least one embodiment of the present disclosure, the total resistance R of the metal oxide semiconductor layer is in a range of 1300Ω-1500Ω; or, the total resistance R of the metal oxide semiconductor layer is in a range of 1100Ω-1200Ω.

For example, in the array substrate provided by at least one embodiment of the present disclosure, a planarization layer is arranged on a surface of the first drain electrode away from the base substrate, a via structure is arranged in the planarization layer, and a pixel electrode is arranged on a side of the via structure away from the base substrate, and the pixel electrode is electrically connected with the first drain electrode through the via structure.

For example, in the array substrate provided by at least one embodiment of the present disclosure, the via structure comprises a first via structure and a second via structure, and a first support structure is arranged on a side of the pixel electrode away from the base substrate and in a region corresponding to the first via structure; a second support structure is arranged on a side of the pixel electrode away from the base substrate and in a region corresponding to the second via structure.

For example, in the array substrate provided by at least one embodiment of the present disclosure, a surface of the first support structure away from the base substrate is recessed to a side close to the base substrate.

For example, in the array substrate provided by at least one embodiment of the present disclosure, the first support structure extends beyond the first via structure in a direction perpendicular to a main surface of the base substrate, and the first support structure extends beyond the first via structure in a direction parallel to the main surface of the base substrate.

For example, in the array substrate provided by at least one embodiment of the present disclosure, the second support structure extends beyond the second via structure along a direction perpendicular to a main surface of the base substrate, and a maximum size of the second support structure in a direction parallel to the main surface of the base substrate is equal to a maximum size of the second via structure in the direction parallel to the main surface of the base substrate.

For example, in the array substrate provided by at least one embodiment of the present disclosure, a cross-sectional shape of, a part of the second support structure extending beyond the second via structure along the direction perpendicular to the main surface of the base substrate, is trapezoidal on a plane perpendicular to the main surface of the base substrate.

For example, in the array substrate provided by at least one embodiment of the present disclosure, a third insulation layer is arranged on a side of the pixel electrode away from the base substrate, and a third electrode is arranged on a side of the third insulation layer away from the base substrate.

For example, in the array substrate provided by at least one embodiment of the present disclosure, a third insulation layer is arranged between the first supporting structure and the pixel electrode, and between the second supporting structure and the pixel electrode, and a third electrode is arranged on a side of the third insulation layer away from the base substrate.

For example, in the array substrate provided by at least one embodiment of the present disclosure, the third electrode comprises metal oxide parts spaced apart from each other and a metal part between the metal oxide parts.

For example, in the array substrate provided by at least one embodiment of the present disclosure, the third electrode comprises a metal part and a metal oxide part covering both a side surface of the metal part and a surface of the metal part away from the base substrate, and the third electrode comprises a plurality of parts spaced apart from each other.

For example, in the array substrate provided by at least one embodiment of the present disclosure, the third electrode comprises a metal oxide part and a metal part arranged on a side of the metal oxide part away from the base substrate, and an orthographic projection of the metal part on the base substrate is within an orthographic projection of the metal oxide part on the base substrate.

For example, in the array substrate provided by at least one embodiment of the present disclosure, along the extension direction of the data line, the metal oxide part is 0.3 micron to 1 micron longer than a length of the metal part disposed on the metal oxide part.

For example, in the array substrate provided by at least one embodiment of the present disclosure, an orthographic projection of at least part of the metal oxide part on the base substrate overlaps with an orthographic projection of the pixel electrode on the base substrate.

For example, in the array substrate provided by at least one embodiment of the present disclosure, the third electrode comprises metal parts spaced apart from each other, and an orthographic projection of the metal parts on the base substrate and an orthographic projection of the pixel electrode on the base substrate at least partially overlap or do not overlap.

For example, in the array substrate provided by at least one embodiment of the present disclosure, at least part of the third electrode is disposed in the first via structure and/or the second via structure.

For example, in the array substrate provided by at least one embodiment of the present disclosure, an opening region is in the third electrode, and the opening region is in a stripe shape, and an included angle between an extension direction of the opening region and the extension direction of the data line is a second included angle, and a value of the second included angle is in a range of 10 degrees-30 degrees.

For example, in the array substrate provided by at least one embodiment of the present disclosure, an orthographic projection of the first drain electrode on the base substrate and an orthographic projection of the light shielding layer on the base substrate at least partially overlap with each other.

For example, in the array substrate provided by at least one embodiment of the present disclosure, an orthographic projection of the first gate electrode on the base substrate and an orthographic projection of the light shielding layer on the base substrate at least partially overlap with each other, and a distance from the first gate electrode to the light shielding layer is in a range of 0 microns-5 microns in a direction perpendicular to a main surface of the base substrate, and a region where the metal oxide semiconductor layer is stacked with the first gate electrode is a channel region, a remaining region is a conductive region, and an orthographic projection of the channel region on the base substrate overlaps with an orthographic projection of a central region of the light shielding layer on the base substrate.

For example, in the array substrate provided by at least one embodiment of the present disclosure, a material of the conductive region and a material of the channel region are different, and the material of the channel region comprises oxygen, indium, gallium and zinc, and the material of the conductive region comprises oxygen, indium, gallium, zinc and boron or phosphorus.

For example, in the array substrate provided by at least one embodiment of the present disclosure, the channel region is a two-layer structure or a three-layer structure, and a density of a layer structure of the channel region away from the base substrate is greater than that of a layer structure of the channel region close to the base substrate.

At least one embodiment of the present disclosure further provides a display panel, and the display panel comprises the array substrate according to any one of the embodiment mentioned above, and a color filter substrate bonded to the array substrate.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
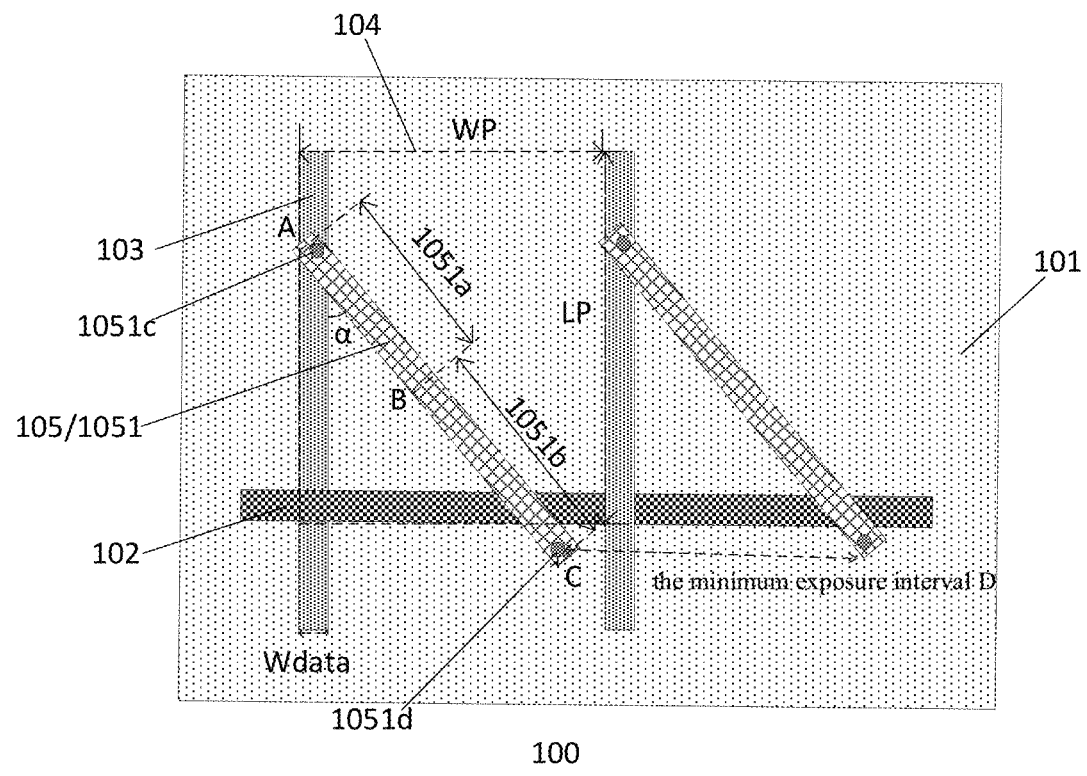
FIG. 1 is a schematic planar view of a gate line, a data line and a metal oxide semiconductor layer provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "comprise," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "left," "right" and the like are only used to indicate relative position relationship, and when the position of the object which is described is changed, the relative position relationship may be changed accordingly.

In the conventional display panel, the connection between the metal oxide semiconductor layer and the data line is connected by an epitaxial metal extending from the metal line, which reduces the aperture ratio of the pixel. The inventors of the present disclosure noticed that the first part of the metal oxide semiconductor layer can be directly connected with the data line, and the orthographic projection of the second part of the metal oxide semiconductor layer on the base substrate can overlap with the orthographic projection of the gate line on the base substrate, but not overlap with the orthographic projection of the data line on the base substrate, so as to improve the aperture ratio of the pixel.

At least one embodiment of the present disclosure provides an array substrate, and the array substrate comprises: a base substrate; a gate line and a data line that are arranged on the base substrate, in which the gate line intersects the data line to define a pixel region; a metal oxide thin film transistor is arranged in the pixel region, and the metal oxide thin film transistor comprises a metal oxide semiconductor layer; the metal oxide semiconductor layer comprises a first part and a second part which are connected with each other, the first part is connected to the data line through a first via hole, the first part is in a stripe shape, and a first included angle is between an extension direction of the first part and an extension direction of the data line, and the first included angle is greater than 0 degree and less than or equal to 90 degrees; an orthographic projection of the second part on the base substrate overlaps with an orthographic projection of the gate line on the base substrate and does not overlap with an orthographic projection of the data line on the base substrate.

For example, FIG. 1 is a schematic diagram of a planar structure of a gate line, a data line and a metal oxide semiconductor layer provided by an embodiment of the present disclosure. As shown in FIG. 1, the array substrate 100 includes: a base substrate 101; a gate line 102 and a data line 103 that are arranged on the base substrate 101, in which the gate line 102 intersect the data line 103 to define a pixel region 104; a metal oxide thin film transistor 105 is disposed in the pixel region 104, the metal oxide thin film transistor 105 includes a metal oxide semiconductor layer 1051; the metal oxide semiconductor layer 1051 comprises a first part 1051a and a second part 1051b which are connected with each other, and the first part 1051a is connected to the data line 103 through a first via hole 1051c, the first part 1051a is in a stripe shape, and a first included angle α is between the extension direction of the first part 1051a and the extension direction of the data line 103, the first included angle α is greater than 0 degrees and less than or equal to 90 degrees; the orthographic projection of the second part 1051b on the base substrate 101 overlaps with the orthographic projection of the gate line 102 on the base substrate 101 and does not overlap with the orthographic projection of the data line 103 on the base substrate 101. For example, in FIG. 1, the case where the overall planar shape of the metal oxide semiconductor layer 1051 is an oblique line is illustrated as an example, that is, the first part 1051a and the second part 1051b of the metal oxide semiconductor layer 1051 extend in the same direction, and the first part 1051a and the second part 1051b extend in a same straight line.

Optionally, the second part 1051b forms an included angle γ with the first part 1051a, and γ>α. For example, γ is an obtuse angle and γ is in a range of 100°-150°. In addition, the oxide semiconductor layer 1051 includes a plurality of parts connected to each other. For example, a third part may be between the first part 1051a and the second part 1051b, and the third part is not on the same straight line with at least one of the first part 1051a and the second part 1051b. Specifically, the included angle γ formed by the third part and the first part 1051a is greater than the first included angle α. For example, the included angle γ is an obtuse angle, and the angle range of 7 is 100°-150°.

Figure 2:
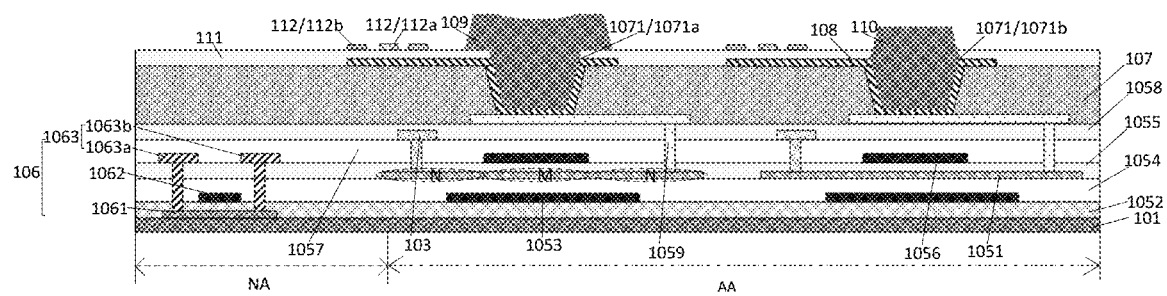
FIG. 2 is a schematic cross-sectional view of an array substrate provided by an embodiment of the present disclosure.

For example, FIG. 2 is a schematic cross-sectional structure diagram of the array substrate provided by an embodiment of the present disclosure. As shown in combination with FIG. 1 and FIG. 2, the metal oxide thin film transistor 105 further includes a first insulation layer 1052, a light shielding layer 1053, a first interlayer insulation layer 1054, a gate insulation layer 1055, a first gate electrode 1056, a second interlayer insulation layer 1057, a first drain electrode 1059 and a second insulation layer 1058 which are sequentially stacked on the base substrate 101. The metal oxide semiconductor layer 1051 is disposed between the first interlayer insulation layer 1054 and the gate insulation layer 1055, the first gate electrode 1056 is connected with the gate line 102, and the second part 1051b is electrically connected with the first drain electrode 1059. The metal oxide thin film transistor 105 is a switch transistor, and the metal oxide thin film transistor 105 is configured to provide a turn-on voltage when the array substrate 100 is used for electro-optical medium driving of a display panel (for example, deflection of liquid crystal molecules), and the metal oxide semiconductor layer 1051 in the metal oxide thin film transistor 105 has transparency, which can bring a high transmittance display effect, so that the display effect of virtual reality technology is further improved.

Alternatively, referring to FIG. 2 and FIG. 1, the first source electrode 103 and the first drain electrode 1059 may be in a same conductive layer or may be formed of different conductive layers. For example, the first source electrode 103 is a conductive layer in the same layer as the data line, and the first drain electrode 1059 is a conductive layer (for example, metal oxide ITO) in a different layer from the data line.

Alternatively, referring to FIG. 2 and FIG. 1, the first source electrode 103 and the first drain electrode 1059 may be in a same conductive layer or may be formed of different conductive layers. For example, the first source electrode 103 is a conductive layer in the same layer as the data line, and the first drain electrode 1059 is a conductive layer (for example, metal oxide ITO) in a different layer from the data line.

Of course, the arrangement of the stacked structure included in the metal oxide thin film transistor 105 in the embodiment of the present disclosure is not limited to this case, and the stacked structure may be arranged in other order. No limitation is imposed to this in the embodiments of the present disclosure, as long as the function of the metal oxide thin film transistor 105 as a switch transistor can be realized.

For example, as shown in FIG. 2, the array substrate 100 further includes a driving transistor 106, the metal oxide thin film transistor 105 is disposed in the display region AA, and the driving transistor 106 is disposed in the peripheral region NA surrounding the display region AA. The driving transistor 106 includes a polysilicon layer 1061, a first insulation layer 1052, a second gate electrode 1062, a first interlayer insulation layer 1054, a gate insulation layer 1055 and a source-drain electrode layer 1063 which are sequentially stacked on the base substrate 101, and the source-drain electrode layer 1063 includes a second source electrode 1063a and a second drain electrode 1063b, and the second source electrode 1063a and the second drain electrode 1063b are electrically connected with the polysilicon layer 1061, respectively. The driving transistor 106 is configured to provide a driving voltage when the array substrate is used for display. The driving transistor 106 can improve the mobility and bring the technical effect of narrow frame by using the polysilicon layer 1061 as a semiconductor layer.

For example, the array substrate integrates the technical effects of high mobility and narrow bezel of the driving transistor 106 made of polysilicon material as the semiconductor layer and the high transmittance display effect of the metal oxide thin film transistor 105 which adopts the semiconductor layer made of the metal oxide semiconductor material, so that the display effect of virtual reality can be further improved when the array substrate is used in a display panel.

For example, as shown in FIG. 2, a planarization layer 107 is provided on the surface of the first drain electrode 1059 away from the base substrate 101, a via structure 1071 is provided in the planarization layer 107, and a pixel electrode 108 is provided on the side of the via structure 1071 away from the base substrate 101, and the pixel electrode 108 is electrically connected with the first drain electrode 1059 through the via structure 1071. For example, a surface of the pixel electrode 108 close to the base substrate 101 in the via structure 1071 is contact with the first drain electrode 1059, thereby increasing the contact area between the pixel electrode 108 and the first drain electrode 1059, making the contact between the pixel electrode 108 and the first drain electrode 1059 more compact, thus making the performance of the metal oxide thin film transistor 105 better.

For example, as shown in FIG. 2, the via structure 1071 includes a first via structure 1071a and a second via structure 1071b. A first support structure 109 is provided on a side of the pixel electrode 108 away from the base substrate 101 and corresponding to the first via structure 1071a, and a second support structure 110 is provided on a side of the pixel electrode 108 away from the base substrate 101 and corresponding to the second via structure 1071b. Both the shapes and sizes of the first support structure 109 and the second support structure 110 are different. In the structure of the subsequently formed display panel, the first support structure 109 can be in contact with the spacer post of the color filter substrate included in the display panel, so as to prevent the first support structure 109 from scratching the color filter substrate or prevent the spacer post from scratching the display substrate.

For example, as shown in FIG. 2, the surface of the first support structure 109, which is away from the base substrate 101, is recessed to the side close to the base substrate 101, so that the spacer post on the color filter substrate can be located at the recessed position of the first support structure 109 in the subsequent formation of the display panel. When the spacer post is to slide down, it must move upward, thus making it more difficult for the spacer post to slide down from the first support structure 109.

For example, as shown in FIG. 2, the first support structure 109 extends beyond the first via structure 1071*a* in a direction perpendicular to the main surface of the base substrate 101, and extends beyond the first via structure 1071*a* in a direction parallel to the main surface of the base substrate 101, thus making the first support structure 109 more stable in the first via structure 1071*a*.

For example, as shown in FIG. 2, the second support structure 110 extends beyond the second via structure 1071*b* along the direction perpendicular to the main surface of the base substrate 101, and the maximum size of the second support structure 110 in the direction parallel to the main surface of the base substrate 101 and the maximum size of the second via structure 1071*b* in the direction parallel to the main surface of the base substrate 101 are equal, so that the second support structure 110 cannot cause more shielding on a plane parallel to the main surface of the base substrate 101.

For example, as shown in FIG. 2, the shape of the cross-section taken along a plane perpendicular to the main surface of the base substrate 101 of, the part of the second support structure 110 extending beyond the second via structure 1071*b* along the direction perpendicular to the main surface of the base substrate 101, is a trapezoid. For example, the length of the first side of the trapezoid away from the base substrate 101 is smaller than the length of the second side of the trapezoid close to the base substrate 101, that is, the trapezoid is a regular trapezoid.

Figure 3:
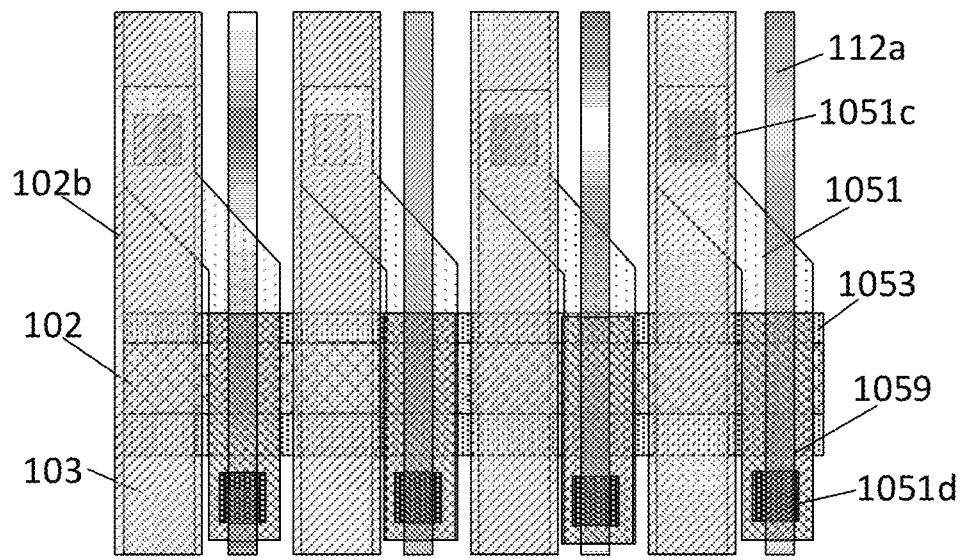
FIG. 3 is a schematic perspective view of an array substrate provided by an embodiment of the present disclosure.

For example, FIG. 3 is a schematic diagram of a perspective structure of the array substrate provided by an embodiment of the present disclosure. as shown in FIG. 2 and FIG. 3, the orthographic projection of the gate line 102 on the base substrate 101 is within the orthographic projection of the light shielding layer 1053 on the base substrate 101, the gate line 102 is located on the side of the light shielding layer 1053 away from the base substrate 101, and the metal oxide semiconductor layer 1051 is located on the side of the gate line 102 away from the base substrate 101. The metal oxide semiconductor layer 1051 and the data line 103 are connected through a first via hole 1051*c*, and the metal oxide semiconductor layer 1051 is electrically connected with the first drain electrode 1059 through a second via hole 1051*d*.

For example, as shown in FIG. 3, the orthographic projection of the first drain electrode 1059 and the orthographic projection of the light shielding layer 1053 on the base substrate 101 at least partially overlap with each other, and the orthographic projection of the first drain electrode 1059 and the orthographic projection of the gate line 102 on the base substrate 101 at least partially overlap with each other.

For example, returning to FIG. 1, combined with FIG. 1 and FIG. 2, the shape of the metal oxide semiconductor layer 1051 on the plane parallel to the main surface of the base substrate 101 is a stripe, and the plane shape of the closed region formed by the intersection of the orthographic projection of the metal oxide semiconductor layer 1051, the orthographic projection of the data line 103 and the orthographic projection of the gate line 102 on the base substrate 101 is a triangle. For example, the triangle is a right triangle with the orthographic projection of the data line 103 on the base substrate 101 and the orthographic projection of the gate line 102 on the base substrate 101 as two right-angled sides. Further, the right triangle formed in the case where the first included angle α is equal to 45 degrees is a right isosceles triangle. The metal oxide semiconductor layer 1051 extends beyond the gate line 102 from the third end A at the interface with the data line 103, and is electrically connected with the first drain electrode 1059 through the second via hole 1051*d* at the first end C away from the first via hole 1051*c*.

Figure 4:
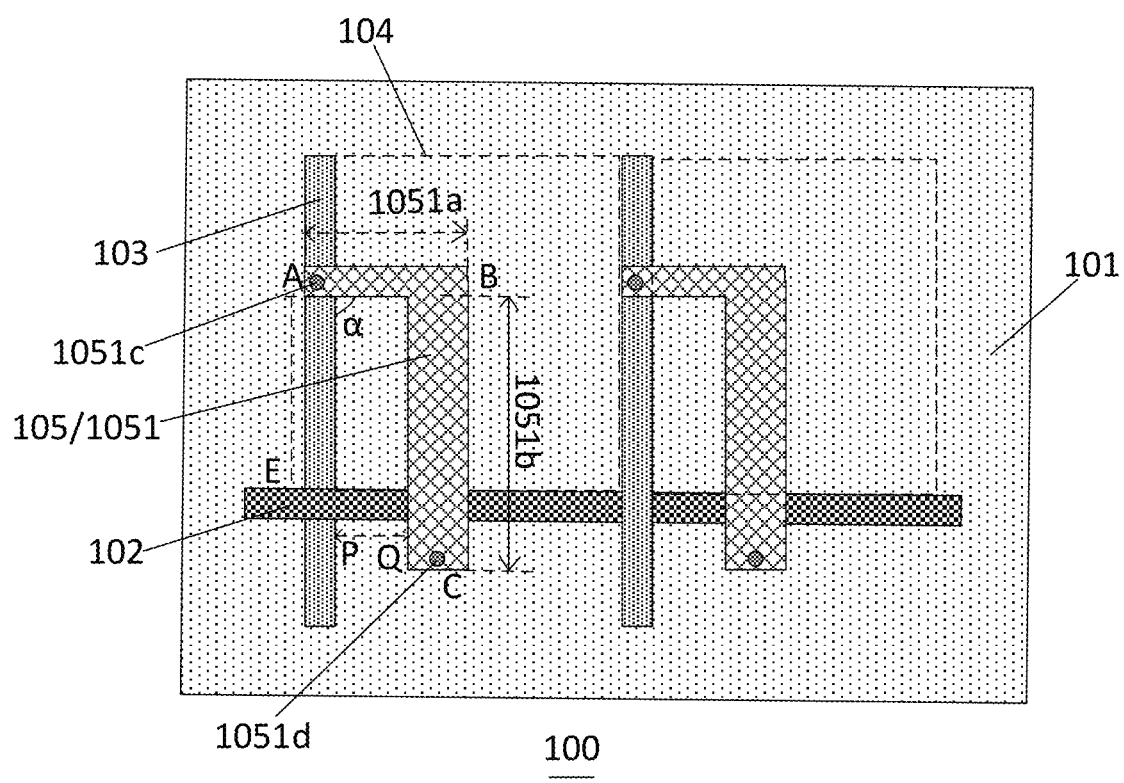
FIG. 4 is a schematic planar view of another gate line, data line and metal oxide semiconductor layer provided by an embodiment of the present disclosure.

For example, FIG. 4 is a schematic diagram of another planar structure of the gate line, the data line and the metal oxide semiconductor layer provided by an embodiment of the present disclosure. As shown in FIG. 4, the shape of the metal oxide semiconductor layer 1051 on a plane parallel to the main surface of the base substrate 101 is a zigzag line, and the shape of the closed region formed by the interaction of the orthographic projection of the metal oxide semiconductor layer 1051 on the base substrate 101, the orthographic projection of the data line 103 on the base substrate 101 and the orthographic projection of the gate lines 102 on the base substrate 101 is a rectangle. It can also be seen from FIG. 4 that the extension direction of the first part 1051*a* and the extension direction of the second part 1051*b* are different and perpendicular to each other, and the width of the second part 1051*b* along the extension direction of the gate line 102 is greater than the width of the first part 1051*a* along the extension direction of the data line 103. In this way, the contact area of the first part 1051*a* with the data line 103 can be smaller, and the first part 1051*a* can occupy a smaller space, which is more conducive to the increase of the proportion of the metal oxide semiconductor layer, so as to further improve the light transmittance. Of course, the embodiment of the present disclosure is not limited to this case.

Figure 5:
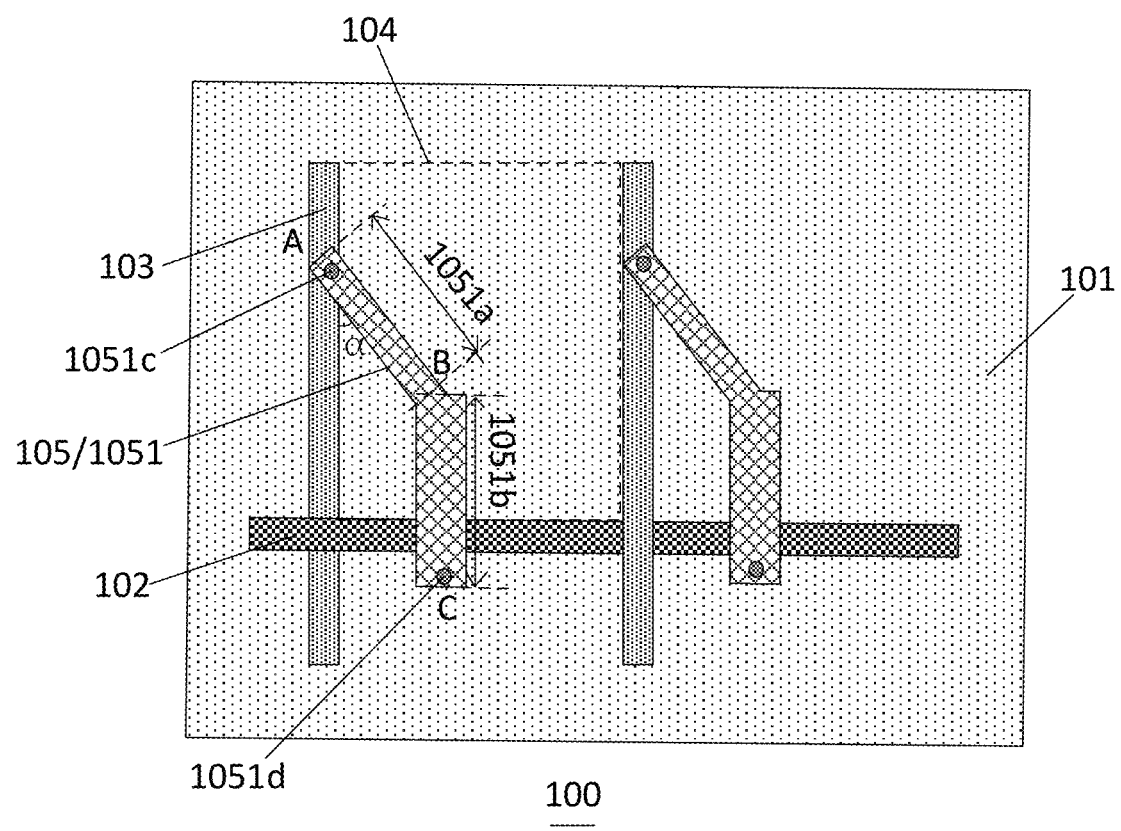
FIG. 5 is a schematic planar view of further another gate line, data line and metal oxide semiconductor layer provided by an embodiment of the present disclosure.

For example, FIG. 5 is a schematic diagram of another planar structure of the gate line, the data line and the metal oxide semiconductor layer provided by an embodiment of the present disclosure. As shown in FIG. 5, the shape of the metal oxide semiconductor layer 1051 on a plane parallel to the main surface of the base substrate 101 is a zigzag line, and the shape of the closed region formed by the interaction of the orthographic projection of the metal oxide semiconductor layer 1051 on the base substrate 101, the orthographic projection of the data line 103 on the base substrate 101 and the orthographic projection of the gate lines 102 on the base substrate 101 is a right trapezoid. It can also be seen from FIG. 5 that the extension direction of the first part 1051*a* and the extension direction of the second part 1051*b* are different, and an included angle between the extension direction of the first part 1051*a* and the extension direction of the second part 1051*b* is an acute angle, and the width of the second part 1051*b* along the extension direction of the gate line 102 is greater than the width of the first part 1051*a* along the direction perpendicular to the extension direction thereof. In this way, the contact area of the first part 1051*a* and the data line 103 can be smaller, and the first part 1051*a* can occupy a smaller space, which is more conducive to the increase of the proportion of the metal oxide semiconductor layer, so as to further improve the light transmittance. Of course, the embodiment of the present disclosure is not limited to this case.

Figure 6:
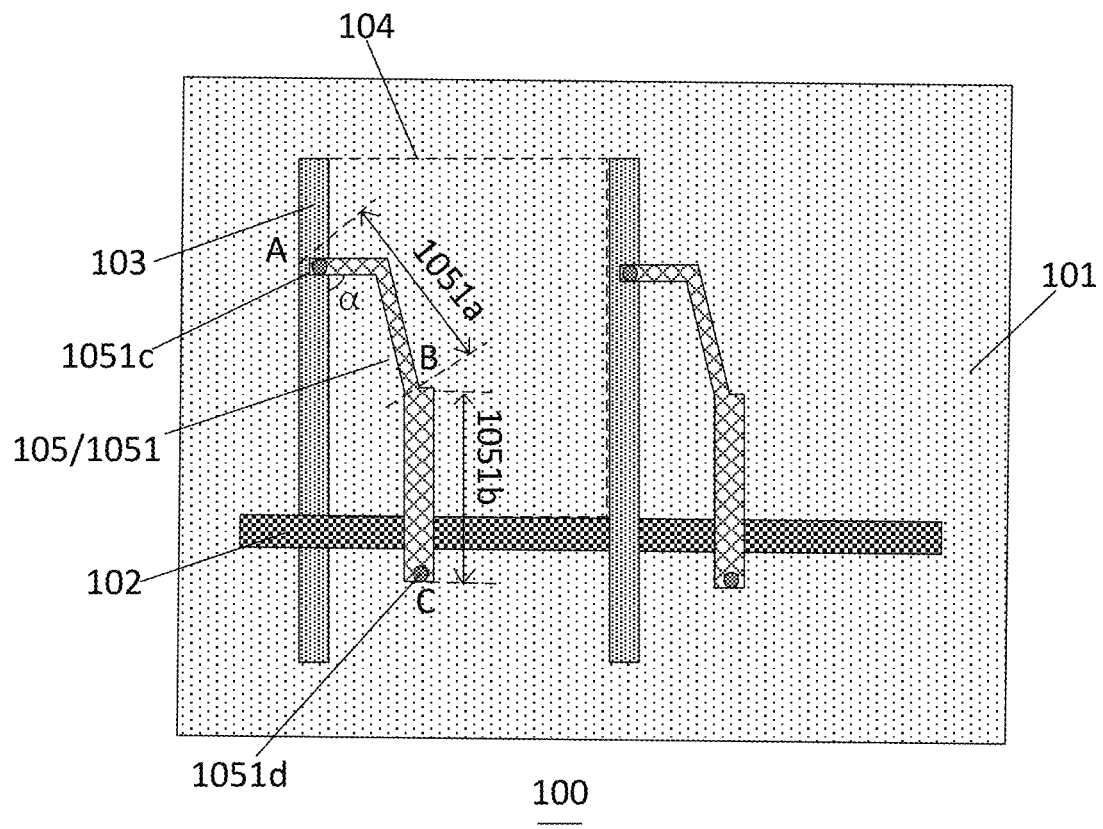
FIG. 6 is a schematic planar view of further another gate line, data line and metal oxide semiconductor layer provided by an embodiment of the present disclosure.

For example, FIG. 6 is a schematic diagram of another planar structure of the gate line, the data line and the metal oxide semiconductor layer provided by an embodiment of the present disclosure. As shown in FIG. 6, the shape of the metal oxide semiconductor layer 1051 on a plane parallel to the main surface of the base substrate 101 is a zigzag line. The planar shape of the closed region formed by the intersection of the orthographic projection of the metal oxide semiconductor layer 1051 on the base substrate 101, the orthographic projection of the data line 103 on the base substrate 101 and the orthographic projection of the gate line 102 on the base substrate 101 is a polygon with the number of sides greater than or equal to 5, which is illustrated by taking a pentagon as an example in FIG. 6. Of course, the embodiments of the present disclosure are not limited to this case, and for example, the polygon may also be hexagonal, heptagonal, octagonal and the like. Further, it can be a pentagon with at least one right angle, a hexagon with at least one right angle, etc., which is not limited by the embodiments of the present disclosure.

For example, in combination with FIG. 4, FIG. 5 and FIG. 6, the second part 1051b is in a stripe shape, and the extension direction of the second part 1051b is the same as that of the data line 103, and the second part 1051b is located between two adjacent data lines 103 in the extension direction of the gate line 102, so that the second part 1051b does not affect the aperture ratio of pixels.

For example, as shown in FIG. 1, FIG. 4, FIG. 5 and FIG. 6, the first end C of the second part 1051b away from the first part 1051a and the second end B of the first part 1051a close to the second part 1051b are located on different sides of the gate line 102 along the extension direction of the data line 103, that is, in FIG. 1, FIG. 4, FIG. 5 and FIG. 6, the first end C is located at the lower side of the gate line 102, and the second end B is located at the upper side of the gate line 102, therefore, the first end C and the second end B are located at different sides of the gate line 102, and the second part 1051b is electrically connected with the first drain electrode 1059 at the position of the first end C, that is, the second part 1051b is electrically connected with the first drain electrode 1059 at the lower side of the gate line 102 and across the gate line 102. For example, a second via hole 1051d is provided at the first end C.

For example, as shown in FIG. 2, the second gate electrode 1062 and the light shielding layer 1053 are arranged in the same layer, that is, the second gate electrode 1062 and the light shielding layer 1053 can be made of the same material, formed in the same one process step and formed in the same layer. For example, the materials of the second gate electrode 1062 and the light shielding layer 1053 may be copper metal, molybdenum metal and other materials with light shielding performance and electrical conductivity, which are not limited by the embodiments of the present disclosure.

For example, as shown in FIG. 2, the source-drain electrode layer 1063 and the first gate electrode 1056 are arranged in the same layer, that is, the source-drain electrode layer 1063 and the first gate electrode 1056 may be made of the same material and formed in the same one process step. The source-drain electrode layer 1063 includes a second source electrode 1063a and a second drain electrode 1063b which are electrically connected to the polysilicon layer 1061 through connection holes respectively, and the connection holes pass through all of the gate insulation layer 1055, the first interlayer insulation layer 1054 and the first insulation layer 1052.

Of course, the source-drain electrode layer 1063 and the data line 103 may be arranged in the same layer. In addition, the driving transistor 106 may further include a second source/drain electrode arranged in a region corresponding to the source-drain electrode layer 1063, and the second source/drain electrode is arranged in the same layer as the source-drain electrode layer 1063. For example, as shown in FIG. 4, the width of the first part 1051a in the extension direction of the data line 103 is 10%~50% of the width of the second part 1051b in the extension direction of the gate line 102, and the area of the first part 1051a is 10%~30% of the area of the second part 1051b. For example, the width of the first part 1051a in the extension direction of the data line 103 is 10%, 20%, 30%, 40% or 50% of the width of the second part 1051b in the extension direction of the gate line 102; the area of the first part 1051a is 10%, 20% or 30% of the area of the second part 1051b. This design can reduce the parasitic capacitance and reduce the load.

For example, in one example, the width of the metal oxide semiconductor layer 105 may be reduced to 1 micron at the minimum. In FIG. 4, the minimum width of the first part 1051a in the extension direction of the data line 103 may be set to 1 micron. For example, the ratio of the minimum width of the first part 1051a in the extension direction of the data line 103 to the width at other positions of the metal oxide semiconductor layer 105 may be in a range of 1:1~1:3, that is, the minimum width of the first part 1051a in the extension direction of the data line 103 may be equal to the width at other positions of the metal oxide semiconductor layer 105, or half or ⅓ of the width at other positions of the metal oxide semiconductor layer 105.

For example, as shown in FIG. 2, a region where the metal oxide semiconductor layer 1051 and the first gate electrode 1056 are stacked is the channel region, that is, the region M marked by the oval dashed line, and the remaining region is the conductive region, that is, the region N marked by the oval dashed line. Along the extension direction of the data line 103, the ratio of the length of the channel region to the length of the conductive region ranges from ⅕ to ¼, for example, the length of the channel region is ⅕ or ¼ of the length of the conductor region, etc., which is not limited by the embodiments of the present disclosure. In one example, the material of the channel region is indium gallium zinc oxide which has semiconductor characteristics. The material of the conductive region is reduced indium gallium zinc oxide which has conductor characteristics.

For example, as shown in FIG. 2, the orthographic projection of the first gate electrode 1056 on the base substrate 101 and the orthographic projection of the light shielding layer 1053 on the base substrate 101 at least partially overlap with each other. In one example, the orthographic projection of the first gate electrode 1056 on the base substrate 101 is within the orthographic projection of the light shielding layer 1053 on the base substrate 101. In the direction perpendicular to the main surface of the base substrate 101, the distance between the first gate electrode 1056 and the light shielding layer 1053 is in a range of 0 micron-5 microns. For example, the orthographic projection of the channel region on the base substrate 101 overlaps with the orthographic projection of the central region of the light shielding layer 1053 on the base substrate 101, and the orthographic projection of the channel region on the base substrate 101 is within the orthographic projection of the light shielding layer 1053 on the base substrate 101.

For example, in one example, the channel region is a two-layer structure or a three-layer structure, and the density of the layer structure of the channel region away from the base substrate 101 is greater than that of the layer structure of the channel region close to the base substrate 101.

For example, the material of the conductive region N and the material of the channel region M are different. The material of the channel region M includes oxygen, indium, gallium and zinc, and the material of the conductive region N includes oxygen, indium, gallium, zinc, boron or phosphorus.

It should be noted that the region where the metal oxide semiconductor layer 1051 and the first gate electrode 1056 are stacked refers to the part where the orthographic projection of the metal oxide semiconductor layer 1051 on the base substrate 101 and the orthographic projection of the first gate electrode 1056 on the base substrate 101 overlap with each other.

For example, with reference to FIG. 1, the pixel region includes pixels, and the proportion of metal oxide semiconductor layer P satisfies $P=S1/S_{total}$, in which S1 is the area of metal oxide semiconductor layer 1051, and the shape of metal oxide semiconductor layer 105 on a plane parallel to the main surface of base substrate 101 is a straight line, and $S_{total}$ is equal to $Lp*W_P$, Lp is a length of the pixel region, and $W_P$ is a width of the pixel region. It is satisfied that S1min≤S1≤S1max, S1min=(D−Wdata)/2*sin α)*(Lp−D), and S1max=(d−wdata)/2*tan α)*($L_P$−d)+(d−wdata)/2*($L_P$−d), in which S1min is the minimum area of the metal oxide semiconductor layer 1051, and S1max is the maximum area of the metal oxide semiconductor layer 1051, and D is the minimum exposure interval, for example, for convenience of value, D may be the interval between oxide semiconductor layers of two adjacent pixels; Wdata is the width of the data line 103 along the extension direction of the gate line 102 on a plane parallel to the main surface of the base substrate 101; α is the first included angle. The value of P may be set according to actual needs, for example, the proportion P of metal oxide semiconductor layers is in a range of 0.20-0.40.

Optionally, the proportion P of the metal oxide semiconductor layer is in a range of 0.23-0.37. Further, the proportion P of the metal oxide semiconductor layer of is in a range of 0.25-0.33. Of course, the proportion P of the metal oxide semiconductor layer may also be other values; for example, the proportion P of the metal oxide semiconductor layer is 0.25, 0.28, 0.3, 0.35 or 0.36.

For example, in the structures shown in FIG. 4, FIG. 5 and FIG. 6, the shape of the metal oxide semiconductor layer 105 on a plane parallel to the main surface of the base substrate 101 is a zigzag line, and S1 is the area of the metal oxide semiconductor layer 1051, that is, the sum of the area of the first part 1051a and the area of the second part 1051b. For other values used for calculating the proportion P of the metal oxide semiconductor layer, please refer to the above-mentioned related description about FIG. 1, which will not be repeated here.

For example, in one example, the proportion P of the metal oxide semiconductor layer is in a range of 0.26-0.32, and the first included angle α is in a range of 100~75°. For example, as shown in FIG. 4, the distance AE from the first via hole A to the gate line 102 is in a range of 4.0 microns-4.8 microns along the extension direction of the data line 103. On the plane parallel to the main surface of the base substrate 101 and in the extension direction parallel to the gate line 102, the distance PQ between the area where the metal oxide semiconductor layer 1051 overlaps the gate line 102 and the data line 103 is in a range of 0.9 microns-1.1 microns; the width of the data line 103 is in a range of 1.3 microns-1.5 microns along the extension direction of the gate line 102, and the thickness of the data line 103 is in a range of 0.8 microns-1.2 microns in the direction perpendicular to the main surface of the base substrate 101. On the plane parallel to the main surface of the base substrate 101, the area of the overlapping region where the metal oxide semiconductor layer 1051 overlaps with the data line 103 is in a range of 0.05 square micron-0.10 square micron; along the extension direction of the data line 103, the width of the gate line 102 is in a range of 2.3 microns-2.8 microns; the light transmittance of the region corresponding to the metal oxide semiconductor layer 1051 is in a range of 50%~70%, for example, the light transmittance of the region corresponding to the metal oxide semiconductor layer 1051 is 55%, 60%, 65% or 70%, etc., which is not limited by the embodiments of the present disclosure.

For example, in the example shown in FIG. 1 or FIG. 5, the first included angle α may be 30 degrees, and the corresponding proportion P of the metal oxide semiconductor layer is in a range of 0.24-0.30. Specifically, the first included angle α can be 30 degrees, and P is in a range of 0.24-0.30.

Optionally, the first included angle α may be in other values. For example, the first included angle α is in a range of 100-75°; or, the first included angle α is in a range of 150-25°; or, the first included angle α is in a range of 300-45°; or the first included angle α is in a range of 450-75°; or, the first included angle α is equal to 20°, 15°, 25°, 33°, 400 or 50°, etc.

For example, the total resistance R of the metal oxide semiconductor layer 1051 satisfies 1.3*Tr*Rs≤R≤2*Tr*Rs, in which Tr is the transmittance of the metal oxide semiconductor layer 1051 in the unit area of the metal oxide semiconductor layer 1051 in the pixel region, and Rs is the square resistance of the metal oxide semiconductor layer 1051.

For example, the derivation process of the above conclusion of 1.3*Tr*Rs≤R≤2*Tr*Rs is as follows:

$$T_{total} = Tr*S1/S_{total} = P1*Tr*S1, \qquad \text{formula (1)}$$

According to $R=\rho(L/dW)=(\rho/d)(L/W)=Rs*L^2/S=Rs*S/W^2$, in which L is approximately equal to the length of the metal oxide semiconductor layer, $$R = Rs*L^2/S1 = P2*Rs/S1 \qquad \text{Formula (2)}$$

Let $P1=1/S_{total}$, and $P2=L^2$.

Formula (1) and Formula (2) are multiplied left and right respectively, and it is concluded that:

$$T_{total}*R = P1*P2*Tr*Rs = M*Tr*Rs \approx Tr*Rs,$$

Optionally, 40%≤TR≤90%; according to the actual needs, the display effect of Tr in this range is better. In addition, Tr can also be measured by measuring the transmittance of the metal oxide semiconductor layer 1051 in the unit area (for example, 1 square micron) at different positions in the same pixel unit, and the corresponding upper value and lower value of transmittance at different positions can be taken as the upper limit value and the lower limit value of the range of Tr, respectively.

Take the embodiment shown in FIG. 1 as an example, that is, take the case where the planar shape of the closed region formed by the intersection of the orthographic projection of the metal oxide semiconductor layer 1051 on the base substrate 101, the orthographic projection of the data line 103 on the base substrate 101 and the orthographic projection of the gate line 102 on the base substrate 101 is a triangle as an example.

$S_{total}$=length*width=f*(L*sin α)*L*cos α), in which L is approximately equal to the length of the metal oxide semiconductor layer (actually the hypotenuse of the formed right triangle), and f*(L*sin α) refers to the side length of the pixel region, which is f times the length of the side of the right triangle overlapping with the gate line in FIG. 1. It is deduced that:

$$R = P1 * P2 * Tr * Rs / T_{total} = M * Tr * Rs / T_{total}$$
$$= (L^2 / S_{total}) * Tr * Rs / T_{toral}$$
$$= L^2 / (f * L * \sin\alpha * L * \cos\alpha) * Tr * Rs / T_{total}$$
$$= (2 / f * \sin 2\alpha) * Tr * Rs / T_{total}$$
$$\approx Tr * Rs / T_{total}$$

According to the example shown in FIG. 1, in the case where f is equal to 2, that is, the planar shape of the closed region formed by the intersection of the orthographic projection of the metal oxide semiconductor layer 1051 on the base substrate 101, the orthographic projection of the data line 103 and the orthographic projection of the gate line 102 on the base substrate 101 is a triangle, and the intersection of the orthographic projection of the gate line 102 on the base substrate 101 and the orthographic projection of the metal oxide semiconductor layer 1051 on the base substrate 101 is the end point of the side edge of the pixel region extending along the extension direction of the gate line 102, and the triangle is a right triangle, that is, α=45°, then it is deduced that:

$$M = P1^* P2 = L^2 / S_{total} = (2 / f^* \sin 2\alpha) = 1$$

That is, R=P1*P2*Tr*Rs/$T_{total}$=M*Tr*Rs/$T_{total}$=Tr*Rs/$T_{total}$.

Understandably, when M=1, R=Tr*Rs/$T_{total}$. According to M=P1*P2=$L^2$/$S_{total}$=(2/f*sin 2α), it can be realized that M=1 by adjusting the factors such as L, F and α, etc. For example: α=15°, f=4, M=P1*P2=$L^2$/$S_{total}$=(2/f*sin 2α)=1. Of course, the range of M is not limited to this case, and M may be equal to other values. For example: M=0.5-1.2.

For example, when $T_{total}$ is always obtained by integrating transmittance and takes the value range of 50%~70%, it is deduced that: 1.3*Tr*Rs≤R≤2*Tr*Rs.

For example, the value range of the block resistance Rs is: Rs=1000Ω/□-1500Ω/□, it is obtained from the transmittance curve that 40%≤Tr≤90%, and finally it is obtained that 780Ω/□≤R≤2250Ω/□.

It should be noted that the total resistance R of the above metal oxide semiconductor layer 1051 is described with the example shown in FIG. 1. For other morphologies of the metal oxide semiconductor layer 1051, for example, FIG. 3 to FIG. 6, the same applies to the total resistance R of the metal oxide semiconductor layer 1051 which satisfies R=P1*P2*TR*Rs/$T_{total}$=M*TR*Rs/$T_{tot}$al, where the optional range of M=($L^2$/$S_{total}$) is 0.5-1.2, and 850Ω/□≤R≤2000Ω/□.

It should be noted that, after actual testing, it is also possible to adjust the transmittance Tr or $T_{total}$ or Rs of the metal oxide semiconductor layer. For example, by changing the temperature and pressure, doping the metal oxide semiconductor layer with elements or changing the proportion of the elements of the metal oxide semiconductor layer, the total resistance of the metal oxide semiconductor layer 1051 can meet the requirements of R=P1*P2*Tr*Rs/$T_{total}$=M*TR*Rs/$T_{total}$, 850Ω/□≤R≤2000Ω/□, and M=0.5-1.2, thus the comprehensive performance of metal oxide semiconductor layer is better. Of course, in addition, it can be realized that the total resistance R of the metal oxide semiconductor layer 1051 satisfies that 1.3*Tr*Rs≤R≤2*Tr*Rs by adjusting the values of the transmittance Tr or $T_{total}$, Rs and M, for example, in one example, M=0.78-1 and $T_{total}$=50%~60%.

Alternatively, the range of R may be 1000Ω/□≤R≤1800 Ω/□.

In the measured samples, the test results at different positions may be slightly different. In order to more accurately express the total resistance of the metal oxide semiconductor layer 1051, the average resistance of the test samples is used to represent the total resistance of the metal oxide semiconductor layer 1051. The average resistance of the metal oxide semiconductor layer 1051 of sample 1 is in a range of 1400Ω-1500Ω; the average resistance of the metal oxide semiconductor layer 1051 of sample 2 is in a range of 1300Ω-1400Ω; the average resistance of the metal oxide semiconductor layer 1051 of sample 3 is in a range of 1100Ω-1200Ω.

For example, in combination with FIG. 2, in one example, a third insulation layer 111 is disposed on the side of the pixel electrode 108 away from the base substrate 101, and a third electrode 112 is disposed on the side of the third insulation layer 111 away from the base substrate 101. The third insulation layer 111 may be formed on a side of both the first support structure 109 and the second support structure 110 that is away from the base substrate 101, or, on a side of both the first support structure 109 and the second support structure 110 that is close to the base substrate 101, which is not limited by the embodiment of the present disclosure.

For example, with reference to FIG. 2, the third insulation layer 111 is disposed between the first supporting structure 109 and the pixel electrode 108, and between the second supporting structure 110 and the pixel electrode 108, and the third electrode 112 is disposed on a side of the third insulation layer 111 away from the base substrate 101.

For example, as shown in FIG. 2, the third electrode 112 includes metal oxide parts 112a spaced apart from each other, and the metal oxide parts 112a are located between the metal parts 112b. For example, the material of the metal parts 112b includes a conductive metal, such as copper metal, molybdenum metal and other materials with light shielding performance and conductive performance, and the material of the metal oxide parts 112a includes a transparent conductive material, such as indium tin oxide, etc. The metal parts 112b can reduce the crosstalk of light in different pixel regions to improve the light efficiency.

For example, in combination with FIG. 2 and FIG. 3, the metal oxide part 112a is formed between adjacent data lines 102, and the orthographic projection of the metal oxide part 112a on the base substrate 101 and the orthographic projection of the metal oxide semiconductor layer 1051 on the base substrate 101 include an overlapping part. The orthographic projection of the metal part 112b on the base substrate 101 and the orthographic projection of the data line 103 on the base substrate 101 overlap each other, and the extension direction of the metal oxide part 112a and the extension direction of the metal part 112b included in the third electrode 112 are both parallel to the extension direction of the data line 103. The metal oxide part 112a may be a common electrode, and for example, the material of the common electrode 112 may be indium tin oxide.

Figure 7:
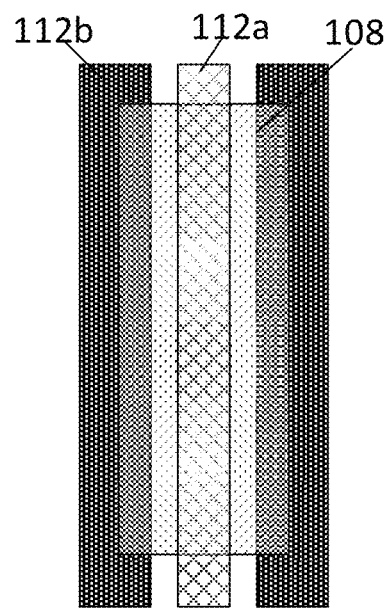
FIG. 7 is a perspective view of the pixel electrode and the third electrode in the cross-sectional structure shown in FIG. 2.

For example, FIG. 7 is a perspective view of the pixel electrode and the third electrode in the cross-sectional structure shown in FIG. 2. As shown in FIG. 7, the orthographic projection of the pixel electrode 108 on the base substrate 101 and the orthographic projection of the metal part 112b on the base substrate 101 at least partially overlap with each other. The third electrode 112 is in a strip shape, and the extension direction of the third electrode 112 is the same as the extension direction of the data line 103. In the direction perpendicular to the extension direction of the data line 102, the width of the pixel electrode 108 is larger than the width of the metal oxide part 112a, that is, the orthographic projection of the pixel electrode 108 on the base substrate 101 spans between the orthographic projection of the metal part 112b on the base substrate 101 and the orthographic projection of the metal oxide part 112a on the base substrate 101.

Figure 8:
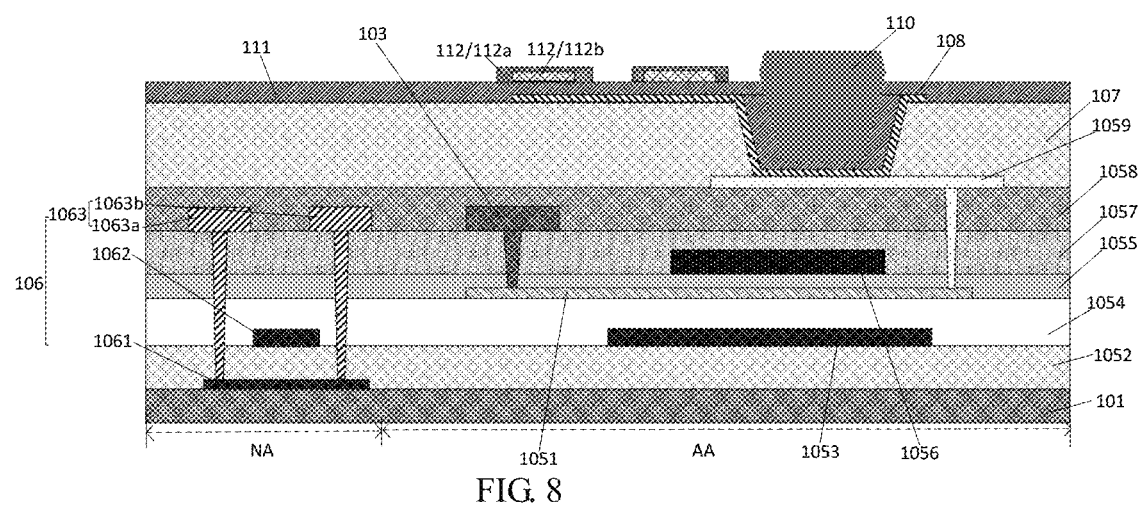
FIG. 8 is a schematic cross-sectional view of still another array substrate provided by an embodiment of the present disclosure.

For example, FIG. 8 is a schematic cross-sectional structure of another array substrate provided by an embodiment of the present disclosure. As shown in FIG. 8, the third electrode 112 includes a metal part 112b, and a metal oxide part 112a that covers the side surfaces of the metal part 112b and the surface of the metal part 112b away from the base substrate 101, and the third electrode 112 includes a plurality of parts spaced from each other, namely, the combinations, each of which is constituted by the metal part 112b and the metal oxide part 112a that covers the side surface of the metal part 112b and the surface of the metal part 112b away from the base substrate 101, are spaced apart from each other.

For example, the difference between FIG. 8 and FIG. 2 is that the source-drain electrode layer 1063 is arranged in the same layer as the data line 103, that is, the source-drain electrode layer 1063 and the data line 103 can be formed in the same one process step and formed in the same layer using the same material. The source-drain electrode layer 1063 includes a second source electrode 1063a and a second drain electrode 1063b which are electrically connected to the polysilicon layer 1061 through connection holes respectively, and the connection holes pass through the four-layer structure formed by the second interlayer insulation layer 1057, the gate insulation layer 1055, the first interlayer insulation layer 1054 and the first insulation layer 1052. Only the second support structure 110 is shown in FIG. 8, and the first support structure 109 is not shown.

Figure 9:
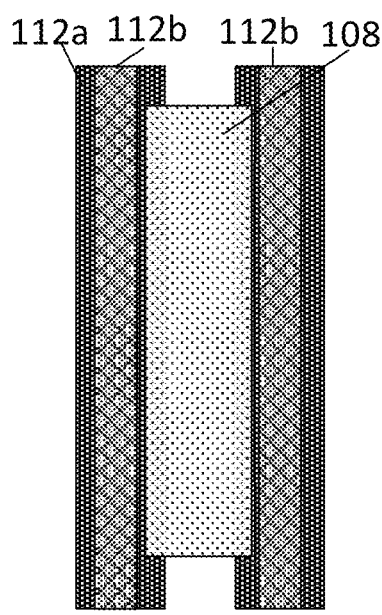
FIG. 9 is a perspective view of the pixel electrode and the third electrode in the cross-sectional structure shown in FIG. 8.

For example, FIG. 9 is a perspective view of the pixel electrode and the third electrode in the cross-sectional structure shown in FIG. 8. As shown in FIG. 9, the orthographic projection of the metal part 112b on the base substrate 101 is within the orthographic projection of the metal oxide part 112a on the base substrate 101, and the orthographic projection of the pixel electrode 108 on the base substrate 101 and the orthographic projection of the metal oxide part 112a on the base substrate 101 at least partially overlap with each other. The orthographic projection of the pixel electrode 108 on the base substrate 101 is bridged between the orthographic projections of adjacent metal oxide parts 112a on the base substrate 101.

Figure 10:
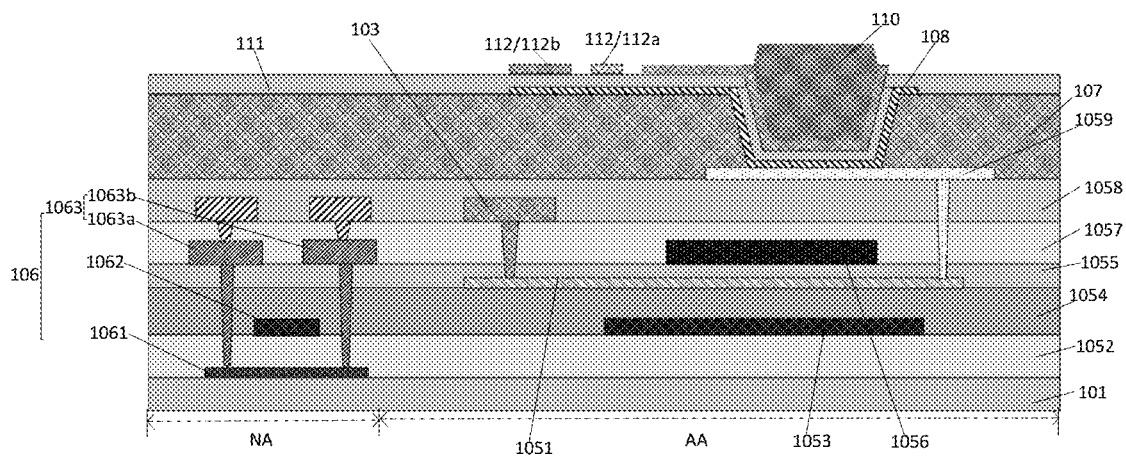
FIG. 10 is a schematic cross-sectional view of an array substrate provided by an embodiment of the present disclosure.

For example, FIG. 10 is a schematic diagram of the cross-sectional structure of the array substrate provided by an embodiment of the present disclosure. The difference between FIG. 10 and FIG. 2 is that in FIG. 10, the metal part 112b included in the third electrode 112 extends into the second via structure 1071b, so that the third electrode 112 and the pixel electrode have more overlapping areas where the two overlap with each other. In FIG. 10, the second source electrode 1063a includes a source base part and a source transfer part, and the second drain electrode 1063b includes a drain base part and a drain transfer part. The source base part and the drain base part both pass through the gate insulation layer 1055, the first interlayer insulation layer 1054 and the first insulation layer 1052, and are arranged in the same layer as the first gate electrode 1056, and the source transfer part and the drain transfer part both pass through the second interlayer insulation layer 1057, and are arranged in the same layer as the data line 103. The second source electrode 1063a and the second drain electrode 1063b are formed in two steps, so that the process steps are not increased, the difficulty of forming a connection hole is reduced, and the stability of electrical connection between the second source electrode 1063a and the remaining polysilicon layer 1061 of the second drain electrode 1063b can be ensured.

Figure 11:
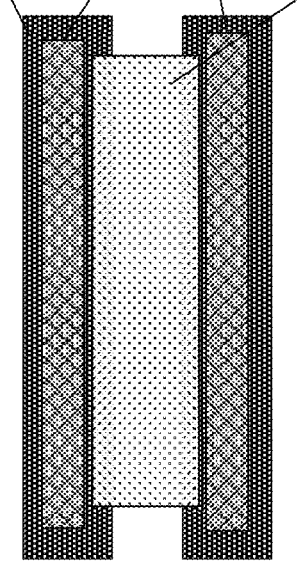
FIG. 11 is a perspective view of yet another pixel electrode and a third electrode provided by an embodiment of the present disclosure.
Figure 12:
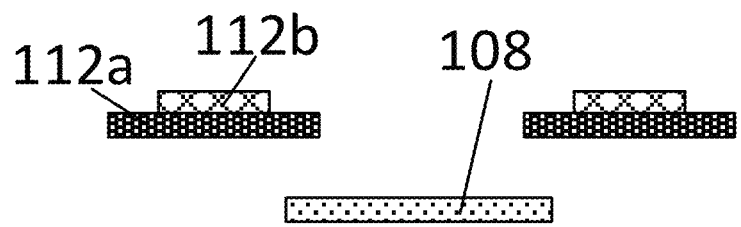
FIG. 12 is a schematic cross-sectional view of the structure shown in FIG. 11.

For example, FIG. 11 is a perspective view of another pixel electrode and the third electrode provided by an embodiment of the present disclosure, and FIG. 12 is a schematic view of the cross-sectional structure shown in FIG. 11. Combining with FIG. 11 and FIG. 12, the third electrode 112 includes a metal oxide part 112a and a metal part 112b disposed on the side of the metal oxide part 112a away from the base substrate 101. That is, the metal oxide part 112a and the metal part 112b form a laminated structure, and the orthographic projection of the metal part 112b on the base substrate 101 is within the orthographic projection of the metal oxide part 112a on the base substrate 101. The pixel electrode 108 is bridged between adjacent metal oxide parts 112a, and the orthographic projection of the pixel electrode 108 on the base substrate 101 and the orthographic projection of the metal oxide part 112a on the base substrate 101 have overlapping portions that overlap with each other.

For example, as shown in FIG. 11, along the extension direction of the data line 103, the metal oxide part 112a is longer than the metal part 112b disposed on the metal oxide part 112a, and the metal oxide part 112a is 0.3 micron to 1 micron longer than the metal part 112b disposed thereon, for example, 0.3 micron, 0.5 micron, 0.8 micron or 1 micron longer.

For example, as shown in FIG. 3 and FIG. 12, along the extension direction of the gate line 102, the orthographic projection of at least part of the metal oxide part 112a on the base substrate 101 overlaps with the orthographic projection of the pixel electrode 108 on the base substrate 101. Along the extension direction of the gate line 102, that is, in the direction perpendicular to the extension direction of the data line 103, the length of the overlapping part between the orthographic projection of the metal oxide part 112a on the base substrate 101 and the orthographic projection of the pixel electrode 108 on the base substrate 101 is in a range of 0.3 micron-1 micron, for example, the length of the overlapping part is 0.3 micron, 0.5 micron, 0.8 micron or 1 micron.

For example, in one example, the third electrode 112 may include only metal parts 112b spaced apart from each other, and does not include the metal oxide part, and the orthographic projection of the metal parts 112b on the base substrate 101 and the orthographic projection of the pixel electrode 108 on the base substrate 101 at least partially overlap with each other or do not overlap with each other. For example, in the case of overlapping, along the extension direction of the data line 103, the length of overlapping part between the orthographic projection of one metal part 112b on the base substrate 101 and the orthographic projection of the pixel electrode 108 on the base substrate 101 is in a range of 0.2 micron~1 micron.

For example, in one example, at least a part of the third electrode 112 is disposed in the first via structure 1071a or the second via structure 1071b, or is disposed in the first via structure 1071a and the second via structure 1071b, so that the third electrode 112 can be stably disposed.

Figure 13:
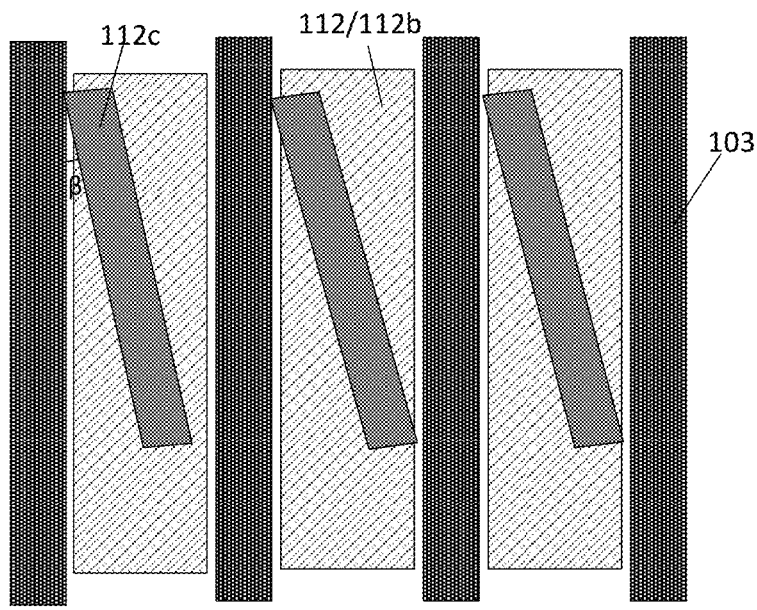
FIG. 13 is a schematic diagram of a third electrode and a data line provided by an embodiment of the present disclosure.

For example, FIG. 13 is a schematic diagram of the third electrode and the data line provided by an embodiment of the present disclosure. As shown in FIG. 13, an opening region 112c is provided in the third electrode 112. For example, the third electrode 112 includes a metal oxide part 112a, and the opening region 112c is located in the metal oxide part 112a, and the opening region 112c is in a stripe shape, and the included angle between the extension direction of the opening region 112c and the extension direction of the data line 103 is a second included angle 3, the second included angle R is in a range of 10 degrees-30 degrees, for example, 10 degrees, 20 degrees or 30 degrees. By setting the opening region 112c in the third electrode 112, the electric field between the third electrode 112 and the pixel electrode 108 can be changed, so that the deflection direction of liquid crystal molecules can be changed.

It should be noted that the third electrode 112 may be formed of metal oxide alone or metal or be formed of alloy. The third electrode can be used as a common electrode to form an electric field with the pixel electrode to drive the liquid crystal molecules. In addition, the third electrode can be located in the same layer as the pixel electrode or in a different layer from the pixel electrode; for example, the metal part of the third electrode 112 is separated from the pixel electrode by the first insulation layer, and the metal oxide part of the third electrode 112 is separated from the pixel electrode by the second insulation layer, and the metal part and the metal oxide part of the third electrode 112 are electrically connected through a via hole penetrating the first insulation layer and the second insulation layer. Of course, the structure of the third electrode 112 is not limited, for example, the third electrode 112 has a mesh structure in the display region, or is a slit-shaped structure or a plate-shaped structure.

Figure 14:
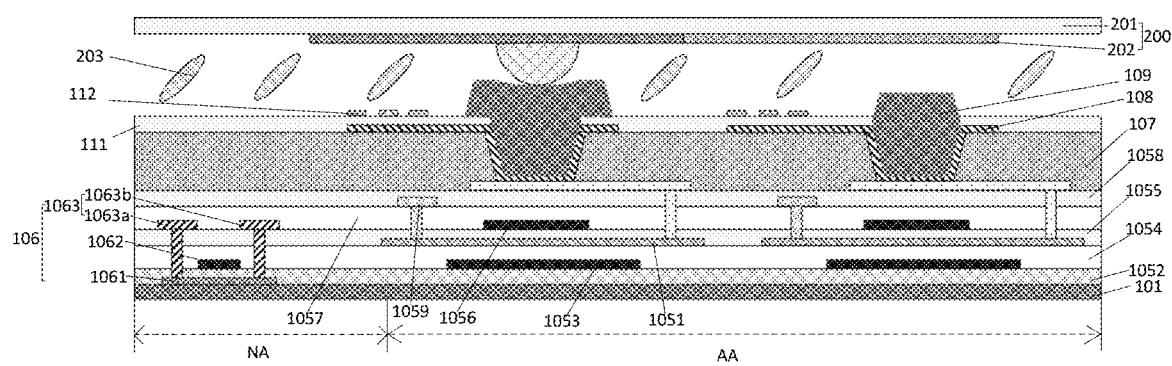
FIG. 14 is a schematic cross-sectional view of a display panel provided by an embodiment of the present disclosure.

At least one embodiment of the present disclosure further provides a display panel including the array substrate in any one of the above embodiments, a color filter substrate opposite to the array substrate, and a liquid crystal layer sandwiched between the array substrate and the color filter substrate. For example, FIG. 14 is a schematic diagram of the cross-sectional structure of the display panel provided by an embodiment of the present disclosure. As shown in FIG. 14, the related structure of the array substrate can refer to the above-mentioned description of FIG. 2. The color filter substrate 200 includes a base layer 201 and a color filter layer 202 arranged on the base layer 201. The related structure of the color filter substrate 200 can be referred to the conventional structure, which is not limited by the embodiments of the present disclosure, and the liquid crystal layer 203 is sandwiched between the array substrate and the color filter substrate.

Of course, the array substrate used in the display panel may be the array substrate in any one of the above embodiments, and is not limited to the related structure in FIG. 2. For example, a color filter is formed on an array substrate.

An array substrate and a display panel provided by at least one embodiment of the present disclosure have at least one of the following beneficial technical effects:

(1) In the array substrate provided by at least one embodiment of the present disclosure, the first part of the metal oxide semiconductor layer and the data line are connected through the first via hole, and the first part is in a stripe shape, and the extension direction of the first part and the extension direction of the data line have a first included angle, the first included angle is greater than 0 degree and less than or equal to 90 degrees; the orthographic projection of the second part on the base substrate overlaps with the orthographic projection of the gate line on the base substrate and does not overlap with the orthographic projection of the data line on the base substrate, thus reducing the source electrode structure and improving the aperture ratio of the pixel.

(2) In the array substrate provided by at least one embodiment of the present disclosure, the metal oxide semiconductor layer in the metal oxide thin film transistor has transparency, which can bring high transmittance display effect, and further improve the display effect of virtual reality technology.

(3) In the array substrate provided by at least one embodiment of the present disclosure, the use of the polysilicon layer as the semiconductor layer of the driving transistor can improve the mobility and bring the technical effect of narrow bezel.

(4) The display panel provided by at least one embodiment of the present disclosure may be a liquid crystal display panel or an electronic device with a display function such as an organic light emitting diode or electronic paper.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

The invention claimed is:

1. An array substrate comprising:
   a base substrate;
   a gate line and a data line that are arranged on the base substrate, wherein the gate line intersects the data line to define a pixel region;
   a metal oxide thin film transistor is arranged in the pixel region, and the metal oxide thin film transistor comprises a metal oxide semiconductor layer;
   the metal oxide semiconductor layer comprises a first part and a second part which are connected with each other, the first part is connected to the data line through a first via hole, the first part is in a stripe shape, and a first included angle is between an extension direction of the first part and an extension direction of the data line, and the first included angle is greater than 0 degree and less than or equal to 90 degrees;
   an orthographic projection of the second part on the base substrate overlaps with an orthographic projection of the gate line on the base substrate and does not overlap with an orthographic projection of the data line on the base substrate; and a shape of the metal oxide semiconductor layer on a plane parallel to a main surface of the base substrate is a zigzag line, and a planar shape of a closed area formed by intersection of an orthographic projection of the metal oxide semiconductor layer, the orthographic projection of the data line and the orthographic projection of the gate line on the base substrate is a rectangle or a right trapezoid;

a width of the first part in the extension direction of the data line ranges from 10% to 50% of a width of the second part in an extension direction of the gate line, and an area of the first part ranges from 10% to 30% of an area of the second part.

2. The array substrate according to claim 1, wherein the metal oxide thin film transistor further comprises a first insulation layer, a light shielding layer, a first interlayer insulation layer, a gate insulation layer, a first gate electrode, a second interlayer insulation layer, a first drain electrode and a second insulation layer which are sequentially stacked on the base substrate, the metal oxide semiconductor layer is arranged between the first interlayer insulation layer and the gate insulation layer, the first gate electrode is connected with the gate line, and the second part is electrically connected with the first drain electrode.

3. The array substrate according to claim 2, further comprising a driving transistor, wherein the metal oxide thin film transistor is arranged in a display region, and the driving transistor is arranged in a peripheral region surrounding the display region;

the driving transistor comprises a polysilicon layer, the first insulation layer, a second gate electrode, the first interlayer insulation layer, the gate insulation layer and a source-drain electrode layer which are sequentially stacked on the base substrate, the source-drain electrode layer comprises a second source electrode and a second drain electrode, and the second source electrode and the second drain electrode are respectively electrically connected with the polysilicon layer.

4. The array substrate according to claim 1, wherein the second part is in a stripe shape, an extension direction of the second part is the same as the extension direction of the data line, and the second part is between adjacent data lines in an extension direction of the gate line.

5. The array substrate according to claim 4, wherein a first end of the second part away from the first part and a second end of the first part close to the second part are located at different sides of the gate line in the extension direction of the data line, and the second part is electrically connected with the first drain electrode at a position of the first end.

6. The array substrate according to claim 3, wherein the second gate electrode is arranged in a same layer as the light shielding layer, and the source-drain electrode layer is arranged in a same layer as the first gate electrode.

7. The array substrate according to claim 1, wherein a region where the metal oxide semiconductor layer and the first gate electrode are stacked is a channel region, and a remaining region is a conductive region, and a ratio of a length of the channel region to a length of the conductive region ranges from 1/5 to 1/4 along the extension direction of the data line.

8. The array substrate according to claim 1, wherein the pixel region comprises pixels, $$P = S_1 / S_{total},$$

P is a proportion of the metal oxide semiconductor layer, $S_1$ is an area of the metal oxide semiconductor layer, and $S_{total}$ is equal to Lp*WP, Lp is a length of the pixel region, and WP is a width of the pixel region;

$$S_{1min} \leq S1 \leq S_{1max},$$

$$S_{1min} = (D - W_{data})/2 * \sin\alpha * (Lp - D),$$

$$S_{1max} = (D - W_{data})/2 * \tan\alpha * (Lp - D) + (D - W_{data})/2 * (Lp - D),$$

$S1_{min}$ is a minimum area of the metal oxide semiconductor layer;

$S1_{max}$ is a maximum area of the metal oxide semiconductor layer;

D is a distance between the oxide semiconductor layers of two adjacent pixels;

$W_{data}$ is a width of the data line along an extension direction of the gate line on a plane parallel to a main surface of the base substrate;

α is the first included angle;

the proportion P of the metal oxide semiconductor layer is in a range of 0.2~0.4.

9. The array substrate according to claim 8, wherein a total resistance R of the metal oxide semiconductor layer satisfies R=M*Tr*Rs/$T_{total}$, Tr is transmittance of the metal oxide semiconductor layer in a unit area of the pixel region, Rs is a square resistance of the metal oxide semiconductor layer, $T_{total}$ is total transmittance of the metal oxide semiconductor layer, and M=0.5-1.2.

10. The array substrate according to claim 2, wherein a planarization layer is arranged on a surface of the first drain electrode away from the base substrate, a via structure is arranged in the planarization layer, and a pixel electrode is arranged on a side of the via structure away from the base substrate, and the pixel electrode is electrically connected with the first drain electrode through the via structure.

11. The array substrate according to claim 10, wherein the via structure comprises a first via structure and a second via structure, and a first support structure is arranged on a side of the pixel electrode away from the base substrate and in a region corresponding to the first via structure; a second support structure is arranged on a side of the pixel electrode away from the base substrate and in a region corresponding to the second via structure.

12. The array substrate according to claim 11, wherein a surface of the first support structure away from the base substrate is recessed to a side close to the base substrate.

13. The array substrate according to claim 12, wherein the first support structure extends beyond the first via structure in a direction perpendicular to a main surface of the base substrate, and the first support structure extends beyond the first via structure in a direction parallel to the main surface of the base substrate.

14. The array substrate according to claim 11, wherein the second support structure extends beyond the second via structure along a direction perpendicular to a main surface of the base substrate, and a maximum size of the second support structure in a direction parallel to the main surface of the base substrate is equal to a maximum size of the second via structure in the direction parallel to the main surface of the base substrate.

15. The array substrate according to claim 14, wherein a cross-sectional shape of, a part of the second support structure extending beyond the second via structure along the direction perpendicular to the main surface of the base substrate, is trapezoidal on a plane perpendicular to the main surface of the base substrate.

16. A display panel, comprising the array substrate according to claim 1, and a color filter substrate bonded to the array substrate.

* * * * *